(12) United States Patent
Ko et al.

(10) Patent No.: US 8,203,072 B2
(45) Date of Patent: Jun. 19, 2012

(54) SOLAR CELL AND METHOD OF MANUFACTURING THE SAME

(75) Inventors: Jihoon Ko, Seoul (KR); Juwan Kang, Seoul (KR); Jonghwan Kim, Seoul (KR); Daehee Jang, Seoul (KR)

(73) Assignee: LG Electronics Inc., Seoul (KR)

( * ) Notice: Subject to any disclaimer, the term of this patent is extended or adjusted under 35 U.S.C. 154(b) by 28 days.

(21) Appl. No.: 12/559,542

(22) Filed: Sep. 15, 2009

(65) Prior Publication Data

US 2010/0258177 A1    Oct. 14, 2010

(30) Foreign Application Priority Data

Jun. 22, 2009 (KR) .......................... 10-2009-0055379

(51) Int. Cl.
*H01L 31/0216* (2006.01)
*H01L 31/0224* (2006.01)

(52) U.S. Cl. ......................... 136/256; 136/252
(58) Field of Classification Search ................. 136/243, 136/252, 256; 438/57, 66, 67, 69, 71, 72, 438/80
See application file for complete search history.

(56) References Cited

U.S. PATENT DOCUMENTS

| | | | | | |
|---|---|---|---|---|---|
| 4,828,628 | A | * | 5/1989 | Hezel et al. | 136/255 |
| 5,380,553 | A | * | 1/1995 | Loboda | 427/226 |
| 6,384,317 | B1 | * | 5/2002 | Kerschaver et al. | 136/256 |
| 2006/0060238 | A1 | * | 3/2006 | Hacke et al. | 136/256 |
| 2006/0112987 | A1 | | 6/2006 | Nakata et al. | |
| 2006/0130891 | A1 | * | 6/2006 | Carlson | 136/256 |
| 2007/0023082 | A1 | * | 2/2007 | Manivannan et al. | 136/258 |
| 2007/0235075 | A1 | | 10/2007 | Park | |
| 2008/0099871 | A1 | * | 5/2008 | Bui et al. | 257/461 |

FOREIGN PATENT DOCUMENTS

| | | |
|---|---|---|
| JP | 2001-68693 A | 3/2001 |
| JP | 2008-34609 A | 2/2008 |
| KR | 10-2005-0094406 A | 9/2005 |
| KR | 10-2006-0069306 A | 6/2006 |
| KR | 10-0682017 B1 | 2/2007 |
| KR | 10-2007-0099938 A | 10/2007 |
| KR | 10-2008-0032866 A | 4/2008 |

OTHER PUBLICATIONS

Xu et al., "Electronic structure and optical properties of α and β phases of silicon nitride, silicon oxynitride, and with comparison to silicon dioxide"; Physical Review B; vol. 51, No. 24; pp. 17379-17389; Jun. 1995.*

* cited by examiner

*Primary Examiner* — Basia Ridley
*Assistant Examiner* — Christina Chern
(74) *Attorney, Agent, or Firm* — Birch, Stewart, Kolasch & Birch, LLP (57) ABSTRACT

A solar cell and a method of manufacturing the same are disclosed. The solar cell includes a substrate of a first conductive type having at least one via hole; an emitter layer only on at least a portion of the via hole and at least one selected from a group consisting of an incident surface and side surfaces of the substrate, the emitter layer having a second conductive type opposite the first conductive type; at least one first electrode on the incident surface, the first electrode being electrically connected to the emitter layer; a second electrode connected to an opposite surface to the incident surface; and at least one first electrode current collector on the opposite surface, the at least one first electrode current collector being insulated from the second electrode and being electrically connected to the at least one first electrode through the via hole.

11 Claims, 8 Drawing Sheets

SOLAR CELL AND METHOD OF MANUFACTURING THE SAME

This application claims priority to and the benefit of Korean Patent Application No. 10-2009-0055379 filed in the Korean Intellectual Property Office on Jun. 22, 2009, the entire contents of which are incorporated herein by reference.

BACKGROUND OF THE INVENTION

1. Field of the Invention

Embodiments relate to a solar cell and a method of manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A general solar cell includes a substrate and an emitter layer, formed of a semiconductor, each having a different conductive type such as a p-type and an n-type, and electrodes respectively formed on the substrate and the emitter layer. The general solar cell also includes a p-n junction formed at an interface between the substrate and the emitter layer.

When light is incident on the solar cell, a plurality of electron-hole pairs are generated in the semiconductor. Each of the electron-hole pairs is separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain an electric power.

At least one current collector like a bus bar is positioned on each of the emitter layer and the substrate, and the current collector on the emitter layer and the current collector on the substrate are connected to the corresponding electrodes, respectively. Hence, charges collected by the electrode easily move to a load connected to the outside through the current collector adjacent to the electrode.

However, in this case, because the current collectors are respectively formed on one surface of the substrate on which the light is not incident and the other surface of the substrate on which the light is incident (i.e., the emitter layer on an incident surface of the substrate), an incident area of the light is reduced. Hence, the efficiency of the solar cell is reduced.

Accordingly, a metal wrap through (MWT) solar cell was developed so as to prevent a reduction in the efficiency of the solar cell resulting from the current collectors. In the MWT solar cell, a current collector connected to an emitter layer was positioned on a rear surface of a substrate opposite an incident surface of the substrate.

SUMMARY OF THE INVENTION

Embodiments provide a solar cell and a method of manufacturing the same capable of improving an efficiency of the solar cell.

In one aspect there is a solar cell including a substrate of a first conductive type having at least one via hole; an emitter layer only on at least a portion of the at least one via hole and at least one selected from a group consisting of an incident surface and side surfaces of the substrate, the emitter layer having a second conductive type opposite the first conductive type; at least one first electrode on the incident surface of the substrate, the first electrode being electrically connected to the emitter layer; a second electrode connected to an opposite surface to the incident surface of the substrate; and at least one first electrode current collector on the opposite surface, the at least one first electrode current collector being insulated from the second electrode and being electrically connected to the at least one first electrode through the at least one via hole.

In another aspect, there is a method of manufacturing a solar cell including forming at least one via hole on a substrate of a first conductive type; forming an emitter layer of a second conductive type opposite the first conductive type only on at least a portion of the at least one via hole and at least one selected from a group consisting of an incident surface and side surfaces of the substrate; and forming a plurality of first electrodes electrically connected to the emitter layer, a first electrode current collector electrically connected to the first electrodes through the at least one via hole, a second electrode that is positioned on the substrate, and a second electrode current collector that is electrically connected to the second electrode.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on"

another element, it can be directly on the other element or intervening elements may also be present. In contrast, when an element is referred to as being "directly on" another element, there are no intervening elements present.

Figure 1:
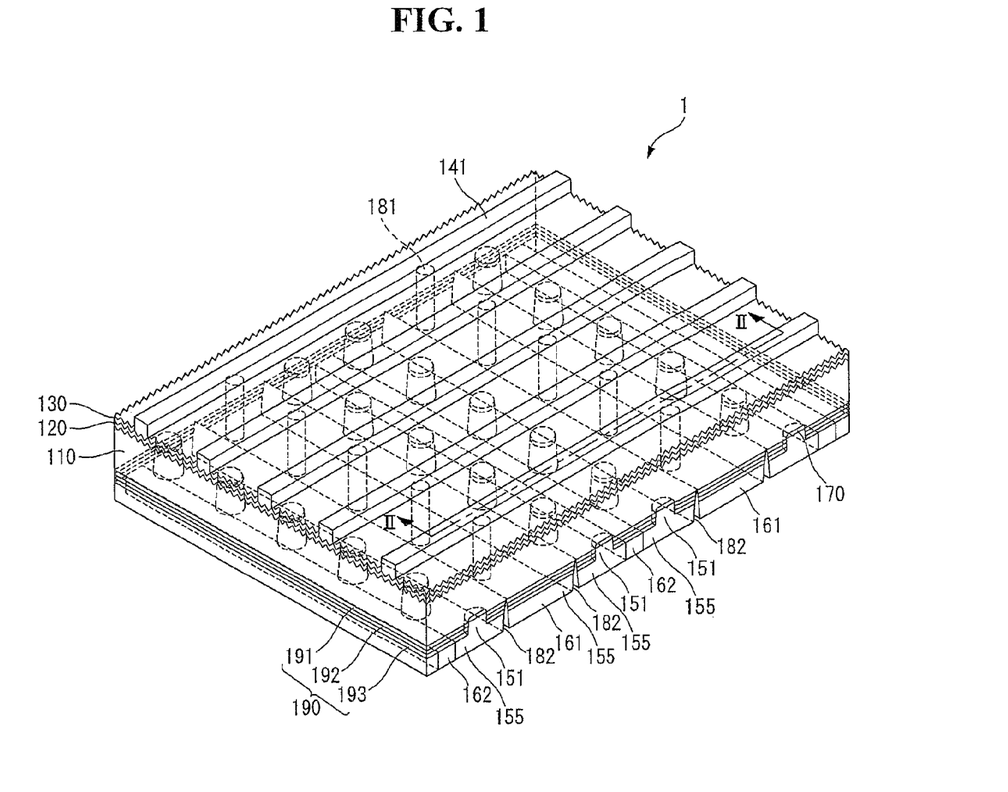
FIG. 1 is a partial perspective view of a solar cell according to an example embodiment.
Figure 2:
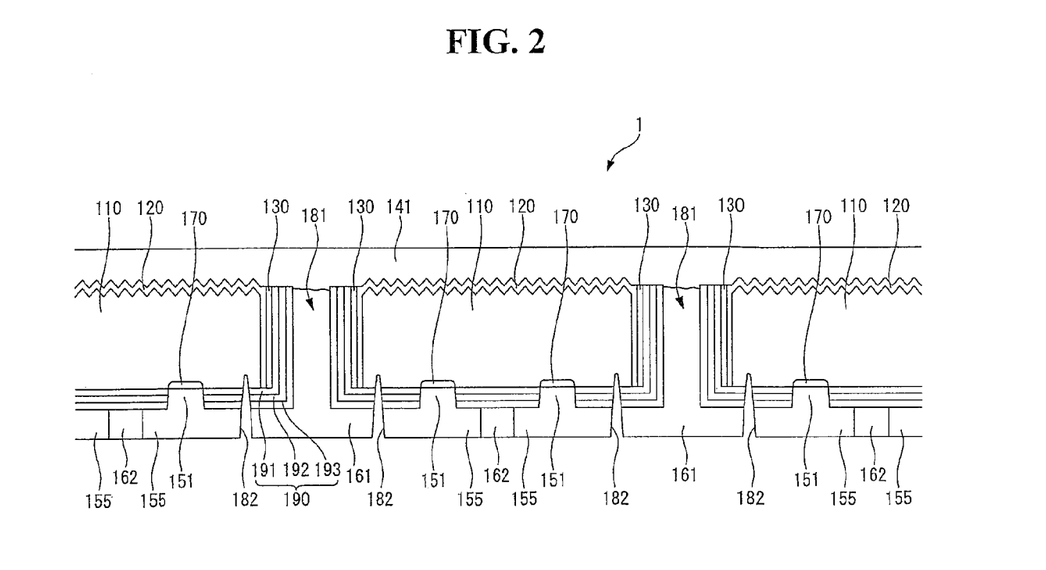
FIG. 2 is a cross-sectional view taken along the line II-II of FIG. 1.

FIG. 1 is a partial perspective view of a solar cell according to an example embodiment. FIG. 2 is a cross-sectional view taken along line II-II of FIG. 1. As shown in FIG. 1, a solar cell 1 according to an embodiment includes a substrate 110 having a plurality of via holes 181, an emitter layer 120 on the substrate 110, an anti-reflection layer 130, a passivation layer 190, a plurality of front electrodes 141, a rear electrode conductive layer 155, a plurality of front electrode current collectors 161 connected to the front electrodes 141, a plurality of rear electrode current collectors 162, and a plurality of back surface field (BSF) layers 170. The anti-reflection layer 130 is positioned on an incident surface (hereinafter, referred to as "a front surface") of the substrate 110, on which light is incident, and on the emitter layer 120 inside the via hole 181. The passivation layer 190 is positioned on a rear surface (also referred to as an opposite surface), opposite the front surface of the substrate 110, on which the light is not incident, and at a side wall of each of the via holes 181. The front electrodes 141 are formed on a portion of the front surface of the substrate 110. The rear electrode conductive layer 155 is positioned on the passivation layer 190 and includes a plurality of rear electrodes 151 electrically connected to the substrate 110. The rear electrode current collectors 162 are connected to the rear electrodes 151 through the rear electrode conductive layer 155. The BSF layers 170 are positioned between the substrate 110 and the rear electrodes 151.

In the example embodiment, the substrate 110 may be formed of silicon doped with impurities of a first conductive type, for example, a p-type, though not required. Examples of silicon include single crystal silicon, polycrystalline silicon, and amorphous silicon. When the substrate 110 is of a p-type, the substrate 110 contains impurities of a group III element such as boron (B), gallium (Ga), and Indium (In). Alternatively, the substrate 110 may be of an n-type, and/or be made of other materials than silicon. When the substrate 110 is of the n-type, the substrate 110 may contain impurities of a group V element such as phosphor (P), arsenic (As), and antimony (Sb).

The surface of the substrate 110 is textured to form a textured surface corresponding to an uneven surface. The plurality of via holes 181 passing through the substrate 110 are formed at each of crossings of the front electrodes 141 and the front electrode current collectors 161.

The emitter layer 120 is an impurity portion having a second conductive type (for example, an n-type) opposite the first conductive type of the substrate 110. The emitter layer 120 and the substrate 110 form a p-n junction.

A plurality of electron-hole pairs produced by light incident on the substrate 110 are separated into electrons and holes by a built-in potential difference resulting from the p-n junction. Then, the separated electrons move toward the n-type semiconductor, and the separated holes move toward the p-type semiconductor. Thus, when the substrate 110 is of the p-type and the emitter layer 120 is of the n-type, the separated holes and the separated electrons move toward the substrate 110 and the emitter layer 120, respectively. Accordingly, the holes in the substrate 110 and the electrons in the emitter layer 120 become major carriers.

Because the substrate 110 and the emitter layer 120 form the p-n junction, the emitter layer 120 may be of the p-type when the substrate 110 is of the n-type unlike the embodiment described above. In this case, the separated electrons and the separated holes move toward the substrate 110 and the emitter layer 120, respectively.

Returning to the embodiment when the emitter layer 120 is of the n-type, the emitter layer 120 may be formed by doping the substrate 110 with impurities of a group V element such as P, As, and Sb. On the contrary, when the emitter layer 120 is of the p-type, the emitter layer 120 may be formed by doping the substrate 110 with impurities of a group III element such as B, Ga, and In.

The anti-reflection layer 130 formed of silicon nitride (SiNx) and/or silicon oxide (SiO$_x$) is positioned on the emitter layer 120 positioned on the front surface of the substrate 110 and at the side wall of the via hole 181. The anti-reflection layer 130 reduces a reflectance of light incident on the substrate 110 and increases a selectivity of a predetermined wavelength band, thereby increasing the efficiency of the solar cell 1. The anti-reflection layer 130 may have a thickness of about 80 nm to 100 nm. Alternatively, the anti-reflection layer 130 may be positioned at only the side wall of each of the via holes 181. The anti-reflection layer 304 may be omitted, if desired.

Although it is not shown in FIGS. 1 and 2, the anti-reflection layer 130 and the emitter layer 120 each have an exposing portion (not shown) exposing a portion of an edge of the front surface of the substrate 110, so as to implement an edge isolation of the substrate 110.

The passivation layer 190 is positioned on the rear surface of the substrate 110 and on the anti-reflection layer 130 positioned at the side wall of each of the via holes 181. The passivation layer 190 reduces a recombination of charges around the surface of the substrate 110 and increases an inner reflectance of light passing through the substrate 110 to thereby increase a re-incidence of the light passing through the substrate 110.

The passivation layer 190 has a three-layered structure including a first passivation layer 191 formed of silicon oxide (SiO$_x$), a second passivation layer 192 formed of silicon nitride (SiNx) on the first passivation layer 191, an a third passivation layer 193 formed of silicon oxynitrides (SiOxNy) on the second passivation layer 192. Other materials may be used for each of the first to third passivation layers 191 to 193.

The first and second passivation layers 191 and 192 change an unstable bond, like a dangling bond, existing around the surface of the substrate 110 into a stable bond to reduce a recombination and/or a disappearance between charges (for example, holes) moving to the substrate 110 and an unstable bond. The third passivation layer 193 protects the first and second passivation layers 191 and 192 from the rear electrode conductive layer 155. The first to third passivation layers 191 to 193 reflect incident light passing through the substrate 110 back to the substrate 110 to increase an inner reflectance of the solar cell 1.

A thickness and a refractive index of each of the first to third passivation layers 191 to 193 may be properly adjusted, so that the first to third passivation layers 191 to 193 perform the above-described operations. For example, the first and third passivation layers 191 and 193 may have the substantially same thickness, such as, a thickness of about 200 nm, and a thickness of the second passivation layer 192 may have a thickness of about 20 nm less than the thickness of the first and third passivation layers 191 and 193, for example. Further, refractive indexes of the second and third passivation layers 192 and 193 may be greater than a refractive index of the first passivation layer 191. In the embodiment, the second passivation layer 192 have a maximum refractive index, and the first passivation layer 191 has a minimum refractive index.

However, the thickness and the refractive index of each of the first to third passivation layers 191 to 193 may vary depending on a material, a function, a formation method, etc., of the first to third passivation layers 191 to 193.

In the embodiment, the passivation layer 190 has the three-layered structure including the first to third passivation layers 191 to 193, but is not limited thereto. The number of layers constituting the passivation layer 190 may vary.

In the embodiment, the first passivation layer 191, the second passivation layer 192, and the passivation layer 193 are sequentially formed on the substrate 110 in the order named, but is not limited thereto. A stacking order of the first to third passivation layers 191 to 193 on the substrate 110 may vary. At least one of the first to third passivation layers 191 to 193 may be formed of amorphous silicon. For example, if the first passivation layer 191 is formed of amorphous silicon, the first passivation layer 191 efficiently inactivates an unstable bond to greatly reduce a recombination of charges on the surface of the substrate 110.

In the embodiment, because the anti-reflection layer 130 and the passivation layer 190 are positioned at the side wall of the via hole 181, the total number of layers formed at the side wall of the via hole 181 may be 2 to 4.

The front electrodes 141 are positioned on the emitter layer 120 formed on the front surface of the substrate 110. In addition, the front electrodes 141 are electrically connected to the emitter layer 120 and extend in a fixed direction to be spaced apart from one another. The front electrodes 141 collect charges (for example, electrons) moving to the emitter layer 120 and transfer the collected charges to the front electrode current collectors 161 through the via holes 181. The front electrodes 141 are formed of at least one conductive metal material. More specifically, the front electrodes 141 may be formed of at least one selected from a group consisting of nickel (Ni), copper (Cu), silver (Ag), aluminum (Al), tin (Sn), zinc (Zn), indium (In), titanium (Ti), gold (Au), and a combination thereof. Other conductive metal materials may be used.

The rear electrode conductive layer 155 is formed of a conductive metal material and is positioned on the passivation layer 190. A plurality of exposing portions 182 exposing a portion of the substrate 110 around the front electrode current collectors 161 are formed in the rear electrode conductive layer 155, the front electrode current collectors 161, and/or the passivation layer 190.

The rear electrodes 151 are formed by the rear electrode conductive layer 155 contacting a portion of the rear surface of the substrate 110 passing through the passivation layer 190. An electrical connection between the rear electrodes 151 and the front electrode current collectors 161 is cut off due to the exposing portions 182.

The rear electrodes 151 are spaced apart from one another at a constant distance and are electrically connected to the substrate 110. The rear electrodes 151 may have various shapes such as a circle, an oval, and/or a polygon. In addition, the rear electrodes 151 may have the same stripe shape as the front electrode 141, and thus the rear electrodes 151 are electrically connected to the substrate 110 and extend in one direction. The number of rear electrodes 151 having the stripe shape is much less than the number of rear electrodes 151 having the circle, oval, or polygon shape.

As above, in the embodiment, because the passivation layer 190 is positioned between the substrate 110 and the rear electrode conductive layer 155 and only a portion of the substrate 110 contacts the rear electrodes 151, a bowing phenomenon of the substrate 110 in the solar cell according to the embodiment is greatly reduced as compared with a solar cell including rear electrodes contacting an entire surface of a substrate. Hence, a damage of the substrate 110 resulting from the bowing phenomenon is greatly reduced. The rear electrodes 151 collect charges (for example, holes) moving to the substrate 110.

The rear electrodes 151 are formed of at least one conductive metal material. More specifically, the rear electrodes 151 may be formed of at least one selected from the group consisting of Ni, Cu, Ag, Al, Sn, Zn, In, Ti, Au, and a combination thereof. Other conductive metal materials may be used.

The plurality of front electrode current collectors 161 are positioned in each of the via holes 181 and on the passivation layer 190 positioned around the via holes 181. The front electrode current collectors 161 extend in a cross direction with respect to the front electrode 141.

The front electrode current collectors 161 are formed of at least one conductive metal material and are electrically connected to the front electrodes 141 crossing the front electrode current collectors 161 through the via holes 181. Accordingly, the front electrode current collectors 161 output charges transferred from the front electrodes 141 to an external device. The front electrode current collectors 161 may be formed of at least one selected from the group consisting of Ni, Cu, Ag, Al, Sn, Zn, In, Ti, Au, and a combination thereof. Other conductive metal materials may be used.

The rear electrode current collectors 162 are positioned on the passivation layer 190 and extend parallel to the front electrode current collectors 161. The rear electrode current collectors 162 collect charges (for example, holes) transferred from the rear electrode 151 through the rear electrode conductive layer 155 to output the collected charges to an external device.

In the embodiment, the rear electrode current collectors 162 have a shape of extending in a fixed direction, similar to the front electrode current collectors 161. However, the rear electrode current collectors 162 may include a plurality of circle or polygon-shaped conductors that are spaced apart from one another at a constant distance or interval, though not required. The rear electrode current collectors 162 are formed of the same material as the front electrode current collectors 161 and are positioned on the same level layer as the front electrode current collectors 161.

The plurality of BSF layers 170 are positioned between the rear electrode 151 and the substrate 110. The BSF layers 170 are areas (for example, a p+-type area) that are more heavily doped with impurities of the same conductive type as the substrate 110 than the substrate 110. The smooth movement of electrons to the rear surface of the substrate 110 is disturbed by a potential barrier resulting from a difference between impurity doping concentrations of the substrate 110 and the BSF layers 170. Accordingly, the BSF layers 170 prevent or reduce a recombination and/or a disappearance of the electrons and holes in an interface of the substrate 110 and the rear electrodes 151.

In the solar cell 1 according to the embodiment having the above-described structure, the front electrode current collectors 161 are positioned on the rear surface of the substrate 110 on which light is not incident, the front electrodes 141 on the front surface of the substrate 110 are electrically connected to the front electrode current collectors 161 using the plurality of via holes 181, and the passivation layer 190 is formed on the rear surface of the substrate 110 to reduce a contact area between the substrate 110 and the rear electrodes 151. An operation of the solar cell 1 will be below described in detail.

When light irradiated to the solar cell 1 is incident on the substrate 110 through the anti-reflection layer 130 and the emitter layer 120, a plurality of electron-hole pairs are generated in the substrate 110 by light energy based on the incident light. Because the surface of the substrate 110 is a textured surface, a light reflectance in the front surface of the substrate 110 is reduced. Further, because both a light incident operation and a light reflection operation are performed on the textured surface, the light is confined in the solar cell 1. Hence, a light absorptance increases, and the efficiency of the solar cell 1 is improved. In addition, because a reflection loss of light incident on the substrate 110 is reduced by the anti-reflection layer 130, an amount of light incident on the substrate 110 further increases.

The electron-hole pairs are separated by the p-n junction of the substrate 110 and the emitter layer 120, and the separated electrons move to the n-type emitter layer 120 and the separated holes move to the p-type substrate 110. The electrons moving to the n-type emitter layer 120 are collected by the front electrodes 141 and then are transferred to the front electrode current collectors 161. The holes moving to the p-type substrate 110 are collected by the rear electrode 151 and then are transferred to the rear electrode current collectors 162. When the front electrode current collectors 161 are connected to the rear electrode current collectors 162 using electric wires (not shown), current flows therein to thereby enable use of the current for electric power.

In the embodiment, because the front electrode current collectors 161 are positioned on the rear surface of the substrate 110 on which light is not incident, an incident area of light increases and the efficiency of the solar cell 1 is improved.

In the embodiment, the passivation layer 190 having a multi-layered structure is positioned between the substrate 110 and the rear electrode conductive layer 155, and the rear electrodes 151 are formed by bringing a portion of the rear electrode conductive layer 155 into contact with the substrate 110, instead of having the rear electrodes formed on the entire rear surface of the substrate 110. Hence, in the solar cell 1 according to the embodiment, a contact area between the rear electrodes 151 and the substrate 110 is greatly reduced as compared with a solar cell including a plurality of rear electrodes on an entire rear surface of a substrate. Nevertheless, because the unstable bond on the surface of the substrate 110 changes into an inactive state (or passivated) by the passivation layer 190, a recombination of charges resulting from the unstable bond on the surface of the substrate 110 is greatly reduced. Accordingly, a use efficiency of light having a long wavelength is improved, and the efficiency of the solar cell 1 is improved.

Figure 3A:
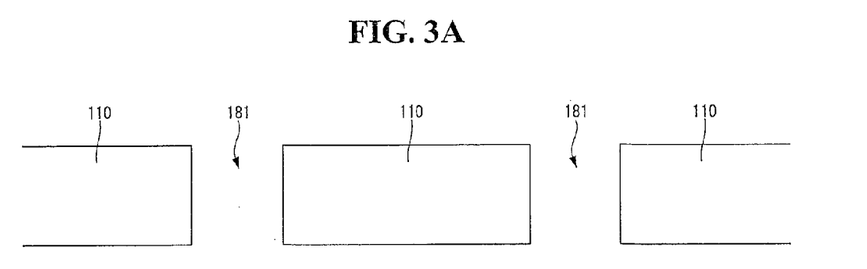
FIGS. 3A to 3M are cross-sectional views sequentially illustrating each of stages in a method of manufacturing a solar cell according to an example embodiment.

FIGS. 3A to 3M are cross-sectional views sequentially illustrating each of stages in a method of manufacturing a solar cell according to an example embodiment. As shown in FIG. 3A, a plurality of via holes 181 are formed on a substrate 110 formed of p-type single crystal silicon or p-type polycrystalline silicon. The via holes 181 are formed through a laser drilling method using a laser beam. Other methods may be used for forming the via holes 181.

Figure 3B:
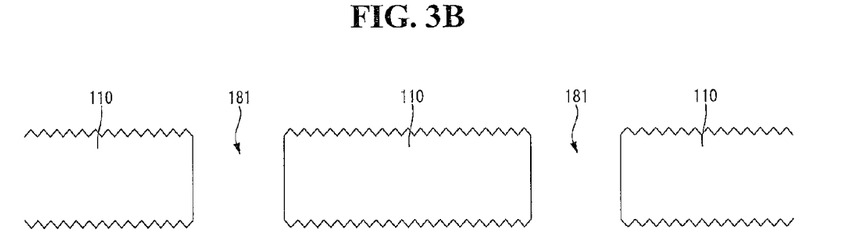

As shown in FIG. 3B, a texturing process is performed on the entire surface of the substrate 110 to form a textured surface of the substrate 110. However, a side wall of each of the via holes 181 need not have the textured surface, though such may be optional. When the substrate 110 is formed of p-type single crystal silicon, the texturing process is performed using a basic solution such as KOH, NaOH, and tetramethylammonium hydroxide (TMAH). When the substrate 110 is formed of p-type polycrystalline silicon, the texturing process is performed using an acid solution such as $HF$ and $HNO_3$.

Figure 3C:
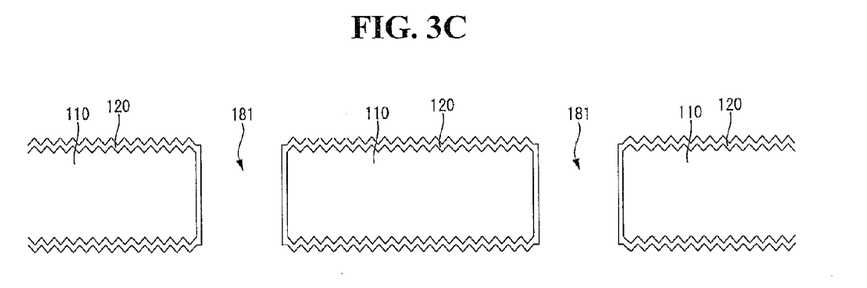

As shown in FIG. 3C, a high temperature thermal process of a material (for example, $POCl_3$ or $H_3PO_4$) containing impurities of a group V element such as P, As, and Sb is performed on the substrate 110 to distribute the group V element impurities on the substrate 110. Hence, an emitter layer 120 is formed on the entire surface of the substrate 110 including a front surface, a rear surface, and an inner surface of the substrate 110 and/or a side surface (or side walls) of each of the via holes 181. Unlike the embodiment, when the substrate 110 is of an n-type, a high temperature thermal process of a material (for example, $B_2H_6$) containing group III element impurities is performed on the substrate 110 or the material containing the group III element impurities is stacked on the substrate 110 to form the p-type emitter layer 120 on the entire surface of the substrate 110. Then, phosphorous silicate glass (PSG) containing phosphor (P) or boron silicate glass (BSG) containing boron (B) produced when p-type impurities or n-type impurities are distributed inside the substrate 110 are removed through an etching process.

Figure 3D:
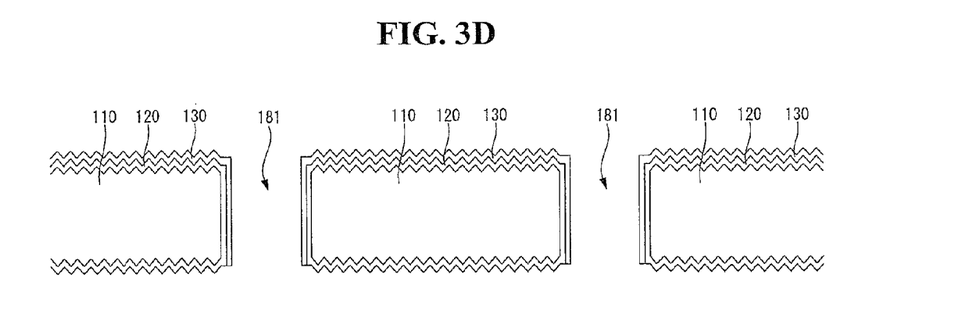

As shown in FIG. 3D, an anti-reflection layer 130 is formed on the front surface of the substrate 110 and at the side wall of each of the via holes 181 using a chemical vapor deposition (CVD) method such as a plasma enhanced chemical vapor deposition (PECVD) method. In addition, the anti-reflection layer 130 may be formed inside the via holes 181.

Figure 3E:
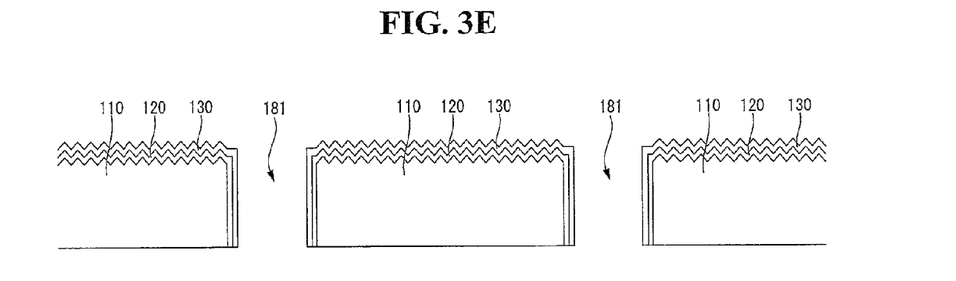

As shown in FIG. 3E, a portion of the rear surface of the substrate 110 is removed using a wet or dry etching method, and thus a portion of the emitter layer 120 on the rear surface of the substrate 110 is removed. In this case, the emitter layer 120 and/or anti-reflection layer 130 formed at the side wall of the via holes 181 may be partially removed.

Alternatively, a removing operation for the portion of the rear surface of the substrate 110 may be avoided or omitted if the emitter layer is not formed on the rear surface of the substrate 110. That is, instead of forming the emitter layer 120 over the entire surface of the substrate 110, including the rear surface of the substrate 110, as shown in FIG. 3C, forming of the emitter layer 120 on the rear surface of the substrate 110 may be avoided or omitted by using a mask or a barrier layer on the rear surface of the substrate 110. The mask or the barrier layer then may be removed, for example, by a separate etching operation.

Figure 3F:
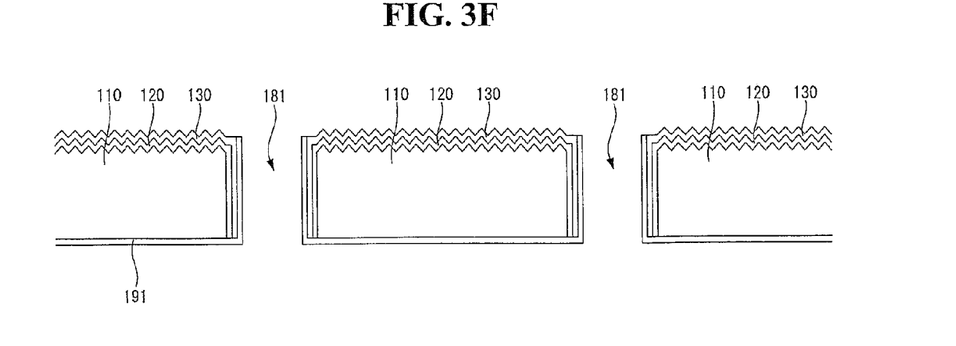
Figure 3G:
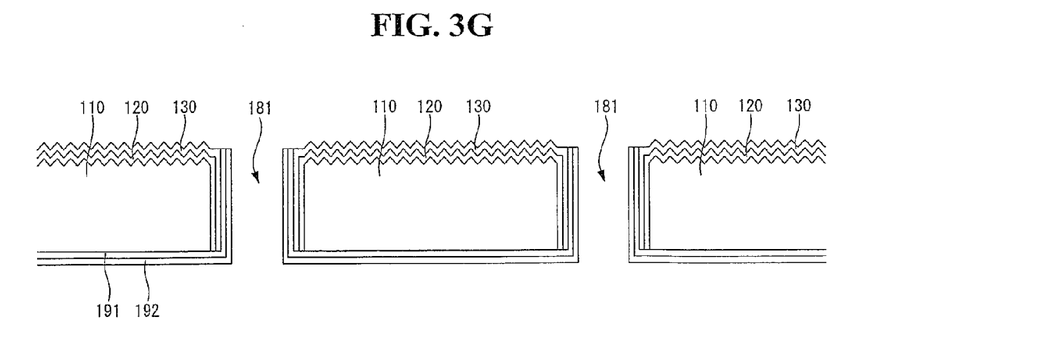
Figure 3H:
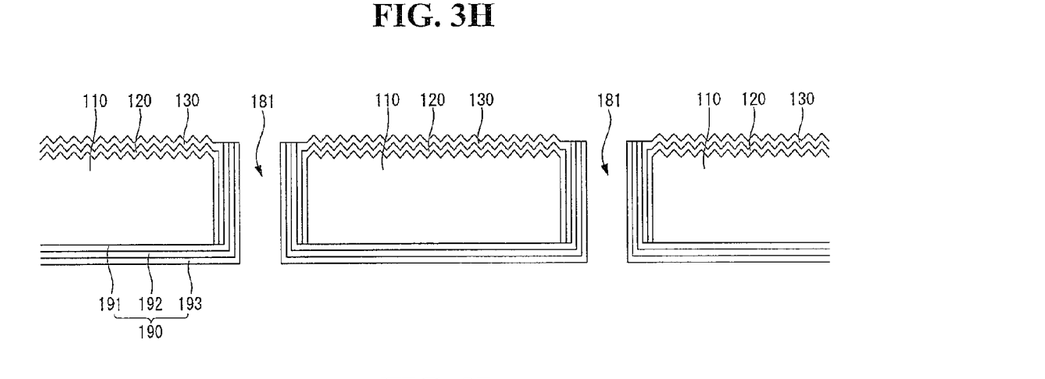

As shown in FIGS. 3F to 3H, a first passivation layer 191 formed of silicon oxide ($SiO_x$), a second passivation layer 192 formed of silicon nitride (SiNx), and a third passivation layer 193 formed of silicon oxynitride (SiOxNy) are sequentially formed on the rear surface of the substrate 110 in the order named using the CVD method such as the PECVD method to complete a passivation layer 190. The first and third passivation layers 191 and 193 each have a thickness of about 200 nm, and the second passivation layer 192 has a thickness of about 20 nm. In forming the passivation layer 190, such as the first through third passivation layers 191-193, on the rear surface of the substrate 110, the passivation layer 190, such as the first through third passivation layers 191-193, may also be deposited in the via hole 181 on the side wall thereof, in the same order as on the rear surface, though such is not required. In embodiments, not all of the first through third passivation layers 191-193 may need to be used or required. That is, components of the passivation layer 190 within the via hole 181 or on the side wall of the via hole 181 may be different from components of the passivation layer 190 on the rear surface of the substrate 110. Accordingly, the passivation layer 190 or components thereof for the via hole 181 and the passivation layer 190 or components thereof for the rear surface of the substrate 110 may be formed together or separately.

Figure 3I:
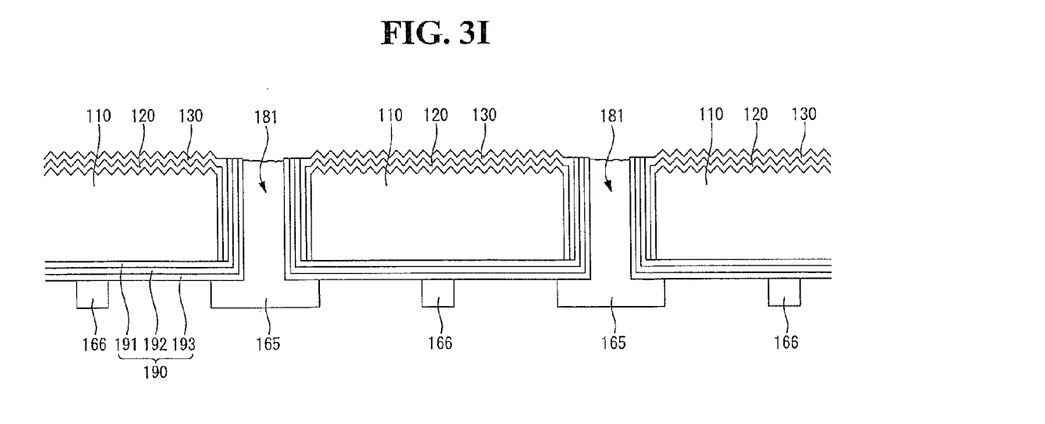

As shown in FIG. 3I, a paste containing Ag is coated on a corresponding portion of the substrate 110 using a screen printing method and then is dried at about 120° C. to 200° C. to form a front electrode current collector pattern 165 and a rear electrode current collector pattern 166.

Figure 3J:
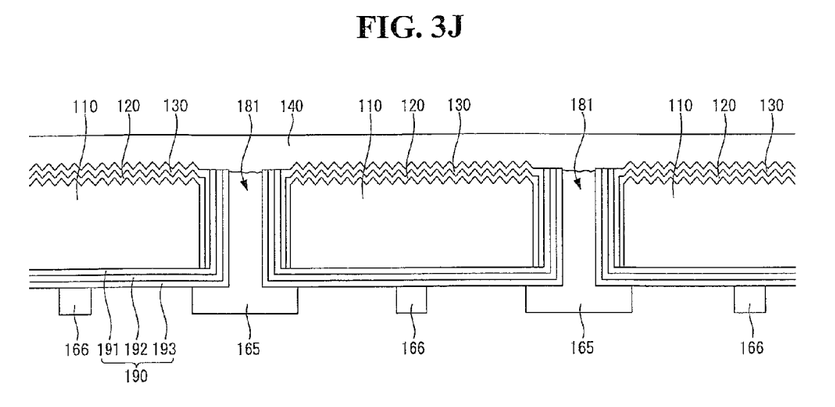

As shown in FIG. 3J, a paste containing Ag is coated on a corresponding portion using the screen printing method and then is dried to form a front electrode pattern 140. The Ag-containing paste forming the front electrode current collector pattern 165, the rear electrode current collector pattern 166, and the front electrode pattern 140 may include at least one selected from the group consisting of Ni, Cu, Al, Sn, Zn, In, Ti, Au, and a combination thereof, instead of Ag. Other conductive metal materials may be used.

Figure 3K:
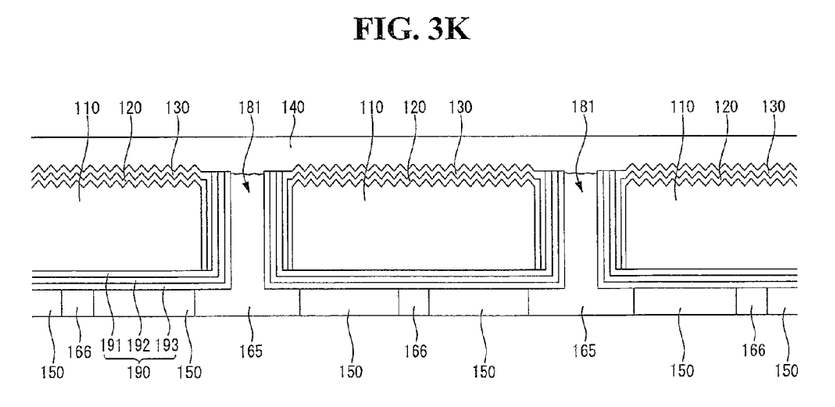

As shown in FIG. 3K, a paste containing Al is coated on a corresponding portion of the substrate 110 using the screen printing method and then is dried to form a rear electrode conductive layer pattern 150. In this case, the rear electrode conductive layer pattern 150 is formed in a remaining portion excluding a formation portion of the front electrode current collector pattern 165 and the rear electrode current collector pattern 166 from the rear surface of the substrate 110. In the embodiment, a formation order of the front electrode pattern 140, the front electrode current collector pattern 165, the rear electrode current collector pattern 166, and the rear electrode conductive layer pattern 150 may vary.

Figure 3L:
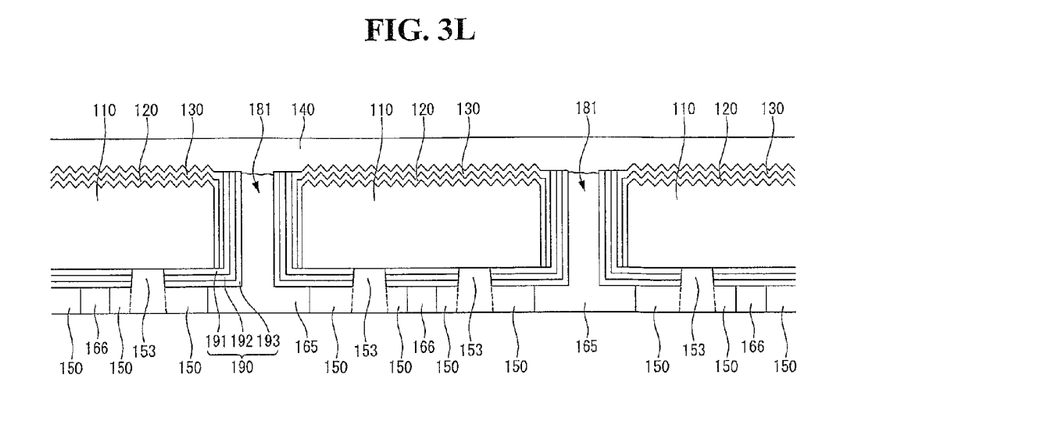

As shown in FIG. 3L, a laser beam is irradiated onto a fixed portion of the rear electrode conductive layer pattern 150 to form rear electrode patterns 153 formed of a molten mixture of components of the rear electrode conductive layer pattern 150, the passivation layer 190, and the substrate 110.

A wavelength of the laser beam used may be approximately 355 nm or 532 nm. When the wavelength of the laser beam is approximately 355 nm, an intensity of the laser beam is approximately 1 W. When the wavelength of the laser beam is approximately 532 nm, an intensity of the laser beam is approximately 10 W. The wavelength and the intensity of the laser beam used may vary depending on a thickness and a material of the rear electrode conductive layer pattern 150, a material and the number of layers of the passivation layer 190, etc. Further, the number of irradiation operations of the laser beam onto the same portion may vary depending on the thickness and the material of the rear electrode conductive layer pattern 150, the material and the number of layers of the passivation layer 190, etc.

Figure 3M:
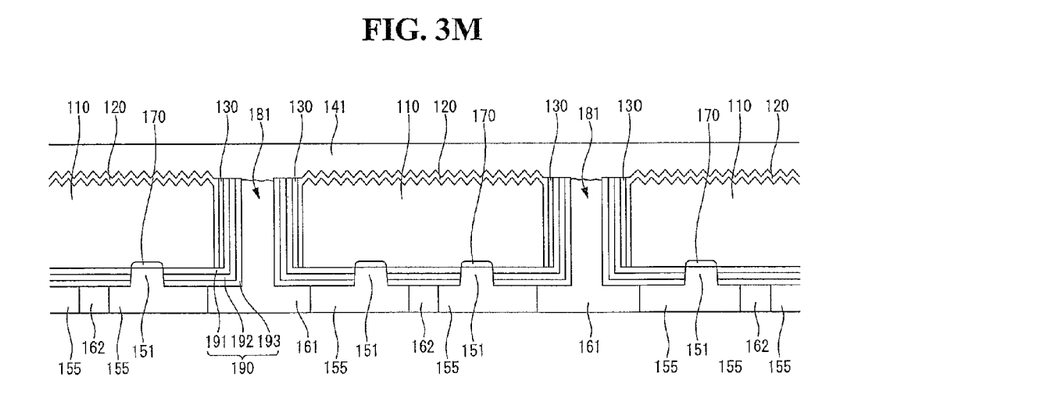

As shown in FIG. 3M, the substrate 110 including the front electrode pattern 140, the front electrode current collector pattern 165, the rear electrode current collector pattern 166, and the rear electrode conductive layer pattern 150 is fired at a temperature of about 750° C. to 800° C. to form a plurality of front electrodes 141, a plurality of front electrode current collectors 161 electrically connected to the front electrodes 141, a rear electrode conductive layer 155 including a plurality of rear electrodes 151, and a plurality of BSF layers 171.

More specifically, when a thermal process is performed, the plurality of front electrodes 141, that pass through contact portions with the anti-reflection layer 130 and the front electrode pattern 140 and contact the emitter layer 120, are formed due to elements such as Pb contained in the front electrode pattern 140. In addition, the rear electrode patterns 153 contact the substrate 110 to form the plurality of rear electrodes 151. In this case, metal components contained in each of the patterns 140, 165, 166, and 150 chemically couples with the layers 120 and 110, and thus a contact resistance is reduced. Hence, a current flow is improved.

Further, when the thermal process is performed, Al contained in the rear electrodes 151 is distributed to the substrate 110 contacting the rear electrodes 151 to form the plurality of BSF layers 171 between the rear electrodes 151 and the substrate 110. In this case, the BSF layers 171 are an area doped with impurities of the same conductive type as the substrate 110, for example, p-type impurities. An impurity doping concentration of the BSF layers 171 is greater than an impurity doping concentration of the substrate 110, and thus the BSF layers 171 are a p+-type area.

In the embodiment, because the anti-reflection layer 130 and the passivation layer 190 are formed at the side wall of each of the via holes 181, a damage of the emitter layer 120 generated when the high temperature thermal process including the drying and firing operations is performed can be reduced or prevented, and a generation of a leakage current can be reduced or prevented. Further, because the passivation layer 190 has the multi-layered structure, the damage of the emitter layer 120 is further reduced or prevented.

Next, a plurality of exposing portions 182 exposing a portion of the substrate 110 are formed around the front electrode current collectors 161 using a laser beam to electrically separate the rear electrodes 151 electrically connected to the substrate 110 from the front electrode current collectors 161. The solar cell 1 shown in FIGS. 1 and 2 is completed thereby. Further, before and after the plurality of exposing portions 182 are formed, a portion of the anti-reflection layer 130 formed at an edge of the front surface of the substrate 110 and a portion of the emitter layer 120 underlying the anti-reflection layer 130 are removed to form an exposing portion (not shown) exposing a portion of the front surface of the substrate 110. Hence, an edge isolation of the substrate 110 is implemented through the exposing portion. In addition, the exposing portions 182 and the exposing portion used in the edge isolation may be formed using a PECVD method instead of the laser beam.

Figure 4:
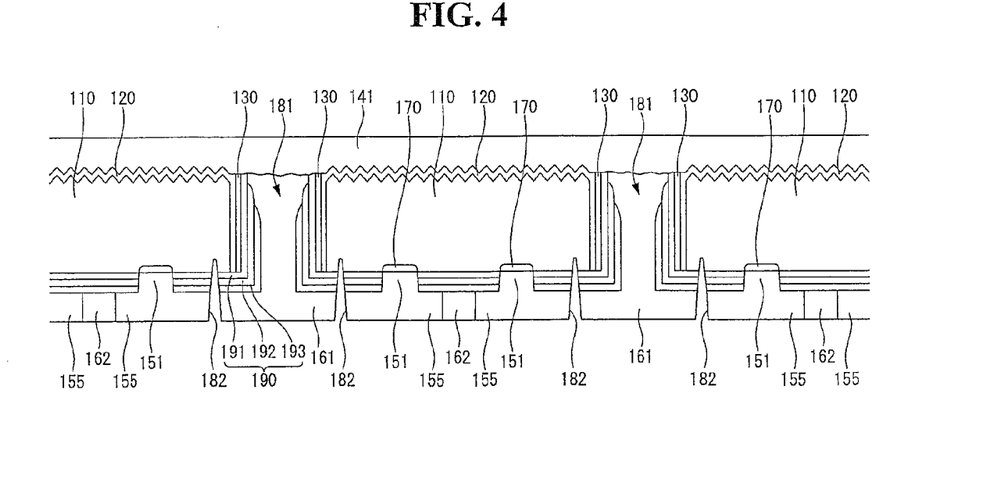
FIG. 4 is another cross-sectional view of a solar cell taken along the line II-II of FIG. 1.

In the solar cell 1 manufactured through the above-described processes, the anti-reflection layer 130 and the passivation layer 190 may be non-uniformly formed at the side wall of the via hole 181 depending on a diameter of the via hole 181, a diffusion speed, a diffusion distance, a diffusion state, etc. when the anti-reflection layer 130 and the passivation layer 190 are formed. Accordingly, as shown in FIG. 4, the number of layers formed at the side wall of the via hole 181 may vary depending on a location of the side wall of the via hole 181. For example, the number of layers formed at the side wall of the via hole 181 increases in a portion adjacent to an injection location of a process gas in a vapor state used to form each of layers constituting the passivation layer 190. Namely, the number of layers formed at the side wall of the via hole 181 increases as the side wall of the via hole 181 approaches the rear surface of the substrate 110.

Further, as shown in FIG. 4, even if the number of layers formed at the side wall of the via hole 181 is constant, a total thickness of layers formed at the side wall of the via hole 181 may vary depending on a the injection location of the process gas, i.e., depending on a distance (i.e., an injection distance) between the injection location of the process gas and the side wall of the via hole 181. Accordingly, the total thickness of layers formed at the side wall of the via hole 181 increases as the side wall of the via hole 181 approaches the rear surface of the substrate 110 (i.e., as the injection distance becomes shorter). However, in this case, because the side wall of the via hole 181 is protected by the anti-reflection layer 130 and the passivation layer 190 including at least one layer, a generation of a leakage current resulting from the damage of the emitter layer 120 after the thermal process is reduced or prevented. During a fabrication of the solar cell 1 through the processes illustrated in FIGS. 3A to 3M, a portion of the substrate 110 may be exposed through the side wall of the via hole 181.

Figure 5:
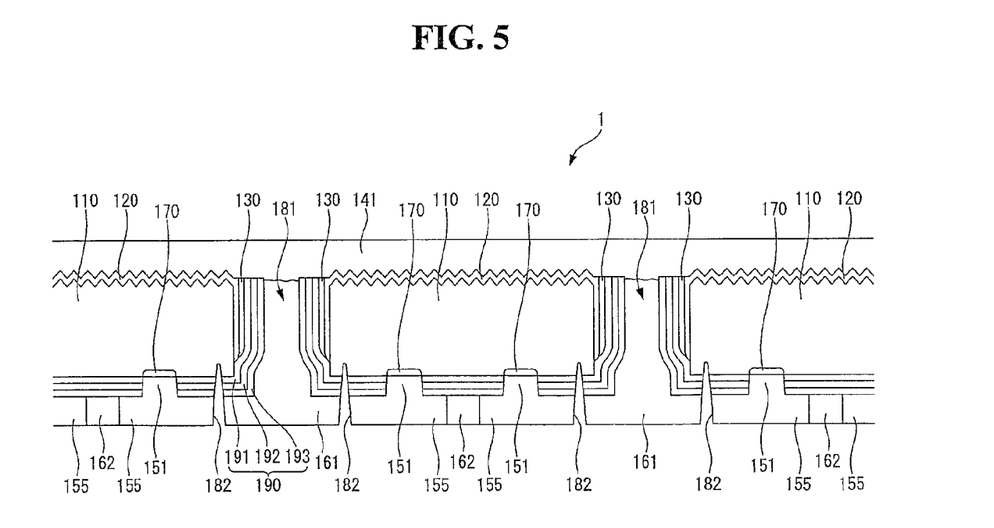
FIG. 5 is another cross-sectional view of a solar cell taken along the line II-II of FIG. 1.

As shown in FIG. 3E, when the emitter layer 120 on the rear surface of the substrate 110 is removed, a portion of the anti-reflection layer 130 inside the via hole 181 and a portion of the emitter layer 120 underlying the anti-reflection layer 130 may be removed. Hence, after a removing process of the emitter layer 120 on the rear surface of the substrate 110, a portion of the substrate 110 may be exposed through the side wall of the via hole 181. In this case, as the emitter layer 120 and the anti-reflection layer 130 approach the rear surface of the substrate 110, a probability to remove the emitter layer 120 and the anti-reflection layer 130 inside the via hole 181 together with the emitter layer 120 on the rear surface of the substrate 110 increases. However, in the embodiment, because the passivation layer 190 having the multi-layered structure is positioned at the side wall of the via hole 181, as shown in FIG. 5, the portion of the substrate 110 exposed at the side wall of the via hole 181 is covered by the anti-reflection layer 130 in a subsequent process.

As shown in FIG. 4, because a formation of the passivation layer 190 is easily performed at the rear surface of the substrate 110 having a high removing probability of the emitter layer 120, the exposed portion of the substrate 110 through at the side wall of the via hole 181 is easily covered by the passivation layer 190. Accordingly, even if the portion of the emitter layer 120 and the portion of the anti-reflection layer 130 are damaged and the portion of the substrate 110 is exposed at the side wall of the via hole 181, the exposed portion of the substrate 110 is protected by the passivation layer 190. Hence, a leakage phenomenon of a current flowing from the front electrode 141 to the front electrode current collector 161 is reduced.

In embodiments of the invention, reference to front or back, with respect to electrode, a surface of the substrate, or others is not limiting. For example, such a reference is for convenience of description since front or back is easily understood as examples of first or second of the electrode, the surface of the substrate or others.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A solar cell, comprising:
    a substrate of a first conductive type having at least one via hole penetrating the substrate;
    an emitter layer positioned on an incident surface of the substrate, the emitter layer having a second conductive type opposite the first conductive type;
    a passivation layer positioned on an opposite surface to the incident surface of the substrate and on at least a portion of a side wall formed by the substrate in the at least one via hole;
    at least one first electrode on the emitter layer positioned on the incident surface of the substrate, the first electrode being directly connected to the emitter layer positioned on the incident surface of the substrate;
    a conductive layer positioned on the passivation layer and having at least one second electrode contacted with the opposite surface to the incident surface of the substrate;
    at least one first electrode current collector on the passivation layer positioned on the opposite surface to the incident surface of the substrate and on the side wall formed by the substrate in the at least one via hole, the at least one first electrode current collector being insulated from the conductive layer and being connected to the at least one first electrode through the at least one via hole;
    wherein the emitter layer is further positioned on the side wall formed by the substrate in the at least one via hole and the passivation layer is further positioned on the emitter layer positioned on the side wall formed by the substrate in the at least one via hole; and
    an antireflection layer positioned on the side wall of the at least one via hole.

2. The solar cell of claim 1, wherein the passivation layer includes at least one layer containing silicon.

3. The solar cell of claim 2, wherein the passivation layer includes a first passivation layer on the opposite surface of the substrate, a second passivation layer on the first passivation layer, and a third passivation layer on the second passivation layer, and
    each of the first, second, and third passivation layers is formed of one of silicon oxide, silicon nitride, silicon oxynitride, or amorphous silicon.

4. The solar cell of claim 3, wherein the first passivation layer is formed of silicon oxide, the second passivation layer is formed of silicon nitride, and the third passivation layer is formed of silicon oxynitride.

5. The solar cell of claim 3, wherein each of the first, second, and third passivation layers has a different refractive index.

6. The solar cell of claim 5, wherein the first passivation layer has a minimum refractive index of the first, second, and third passivation layers, and the second passivation layer has a maximum refractive index of the first, second, and third passivation layers.

7. The solar cell of claim 3, wherein a thickness of the passivation layer formed on the side wall of the at least one via hole varies depending on a formation location of the passivation layer.

8. The solar cell of claim 7, wherein the thickness of the passivation layer formed on the side wall of the at least one via hole increases as the side wall of the at least one via hole approaches the opposite surface of the substrate.

9. The solar cell of claim 8, wherein a number of layers constituting the passivation layer formed on the side wall of the at least one via hole increases as the side wall of the at least one via hole approaches the opposite surface of the substrate.

10. The solar cell of claim 1, wherein the anti-reflection layer is formed of silicon oxide or silicon nitride.

11. The solar cell of claim 1, further comprising at least one second electrode current collector positioned on the passivation layer and connected to the conductive layer.

* * * * *